US009162877B2

(12) United States Patent
Chang et al.

(10) Patent No.: US 9,162,877 B2
(45) Date of Patent: Oct. 20, 2015

(54) LATERAL ETCH STOP FOR NEMS RELEASE ETCH FOR HIGH DENSITY NEMS/CMOS MONOLITHIC INTEGRATION

(71) Applicant: International Business Machines Corporation, Armonk, NY (US)

(72) Inventors: Josephine B. Chang, Mahopac, NY (US); Leland Chang, New York, NY (US); Sebastian U. Engelmann, White Plains, NY (US); Michael A. Guillorn, Yorktown Heights, NY (US)

(73) Assignee: GlobalFoundries U.S. 2 LLC, Hopewell Junction, NY (US)

( * ) Notice: Subject to any disclaimer, the term of this patent is extended or adjusted under 35 U.S.C. 154(b) by 0 days.

(21) Appl. No.: 14/621,039

(22) Filed: Feb. 12, 2015

(65) Prior Publication Data
US 2015/0151961 A1    Jun. 4, 2015

Related U.S. Application Data

(62) Division of application No. 13/269,552, filed on Oct. 7, 2011, now Pat. No. 9,000,556.

(51) Int. Cl.
*H01L 21/00* (2006.01)
*B81C 1/00* (2006.01)
*H01L 21/84* (2006.01)
*H01L 27/12* (2006.01)
*H01L 21/56* (2006.01)

(52) U.S. Cl.
CPC ........... *B81C 1/0023* (2013.01); *B81C 1/00801* (2013.01); *H01L 21/845* (2013.01); *H01L 27/1211* (2013.01); *B81B 2207/015* (2013.01); *B81C 2203/0714* (2013.01); *B81C 2203/0742* (2013.01); *H01L 21/565* (2013.01); *H01L 2924/0002* (2013.01)

(58) Field of Classification Search
CPC .................. H01L 2924/0002; H01L 2924/00; H01L 21/565; H01L 21/845; H01L 27/1211; B81C 1/00801; B81C 2203/0714; B81C 2203/0742
USPC .......................... 438/107, 112, 127, 400, 50; 257/21.502, E27.112
See application file for complete search history.

(56) References Cited

U.S. PATENT DOCUMENTS

| | | |
|---|---|---|
| 6,291,875 B1 | 9/2001 | Clark et al. .................. 257/622 |
| 6,774,418 B2 | 8/2004 | Moore |
| 6,887,391 B1 | 5/2005 | Daneman et al. ................. 216/2 |
| 7,061,660 B1 | 6/2006 | Chen et al. .................... 359/238 |

(Continued)

OTHER PUBLICATIONS

International Search Report and Written Opinion, PCT Application No. PCT/US2012/059152, p. 1-9 (Dec. 26, 2012).

(Continued)

*Primary Examiner* — Duy T Nguyen
(74) *Attorney, Agent, or Firm* — Ido Tuchman

(57) ABSTRACT

Structure and method for fabricating a barrier layer that separates an electromechanical device and a CMOS device on a substrate. An example structure includes a protective layer encapsulating the electromechanical device, where the barrier layer may withstand an etch process capable of removing the protective layer, but not the barrier layer. The substrate may be silicon-on-insulator or a multilayer wafer substrate. The electromechanical device may be a microelectromechanical system (MEMS) or a nanoelectromechanical system (NEMS).

10 Claims, 6 Drawing Sheets

(56) References Cited

U.S. PATENT DOCUMENTS

| | | | |
|---|---|---|---|
| 7,079,301 B2 | 7/2006 | Monroe et al. | 359/290 |
| 7,573,111 B2 | 8/2009 | Patel et al. | 257/414 |
| 7,581,314 B2 | 9/2009 | Deligianni et al. | 29/852 |
| 7,618,837 B2 | 11/2009 | Yan et al. | 438/51 |
| 7,837,887 B2 | 11/2010 | McReynolds et al. | |
| 7,985,611 B1 | 7/2011 | Ivanov et al. | |
| 2003/0048149 A1 | 3/2003 | Deligianni et al. | 333/101 |
| 2003/0085436 A1 | 5/2003 | Moore | 257/408 |
| 2006/0063376 A1 | 3/2006 | Lee et al. | |
| 2007/0075309 A1 | 4/2007 | Zhong et al. | |
| 2007/0281381 A1 | 12/2007 | Avazi | |
| 2007/0290364 A1 | 12/2007 | Gupta et al. | 257/777 |
| 2008/0006889 A1 | 1/2008 | Diamond et al. | 257/414 |
| 2008/0074725 A1* | 3/2008 | Pan | 359/291 |
| 2008/0119000 A1 | 5/2008 | Yeh et al. | 438/50 |
| 2008/0142912 A1 | 6/2008 | Inaba et al. | 257/414 |
| 2008/0164543 A1 | 7/2008 | Ziglioli et al. | 257/415 |
| 2009/0014296 A1* | 1/2009 | Weber et al. | 200/181 |
| 2010/0035387 A1 | 2/2010 | Chou | 438/142 |
| 2010/0090304 A1 | 4/2010 | Liu et al. | |
| 2010/0116632 A1 | 5/2010 | Smith et al. | |
| 2010/0314668 A1 | 12/2010 | Ollier et al. | |
| 2011/0003421 A1 | 1/2011 | Kumar et al. | |
| 2011/0109405 A1 | 5/2011 | Buchwalter et al. | |
| 2011/0265574 A1 | 11/2011 | Yang | |
| 2012/0038037 A1* | 2/2012 | Chen et al. | 257/734 |

OTHER PUBLICATIONS

D. A. Czaplewski et al., "A nanomechanical switch for integration with CMOS logic," J. Micromech. Microeng. vol. 19, 2009, 085003.

G. K. Fedder et al., "Technologies for Cofabricating MEMS and Electronics," Proceedings of the IEEE, vol. 96, No. 2, 2008, pp. 306-322.

R. T. Howe et al., "Low-Temperature LPCVD MEMS Technologies," Mat. Res. Soc. Symp. Proc., vol. 729, 2002, pp. U5.1.1-U5.1.9.

* cited by examiner

LATERAL ETCH STOP FOR NEMS RELEASE ETCH FOR HIGH DENSITY NEMS/CMOS MONOLITHIC INTEGRATION

CROSS-REFERENCE TO RELATED APPLICATIONS

This application is a divisional application claiming benefit under 35 U.S.C. §120 to the filing date of U.S. Pat. No. 9,000,556 issued Apr. 7, 2015 (U.S. patent application Ser. No. 13/269,552 filed Oct. 7, 2011), the entire text of which is specifically incorporated by reference herein.

BACKGROUND

This invention relates to fabricating an electromechanical system and a complementary metal oxide semiconductor (CMOS) device on a silicon-on-insulator (SOI) substrate. More particularly, the present invention relates to a method for fabricating an integrated semiconductor device with a barrier layer, and a semiconductor device structure including a barrier layer to separate the electromechanical system from the CMOS device.

The integration of electromechanical and CMOS integrated circuits is being pursued for a variety of applications. For example, nanoelectromechanical systems (NEMS) may form part of a resonant transducer and signal processor by serving as a passive filter or mixing element. NEMS devices are suitable for silicon-on-insulator (SOI) technology, which also corresponds well to integration with CMOS devices.

In order to achieve integration with SOI electromechanical systems and CMOS devices, several challenges need to be overcome. An electromechanical structure may require some freedom of mechanical movement that entails releasing the structure from an underlying layer, such as a buried oxide (BOX) layer. Mechanical movement may involve simple resonation of a device or the translation of mechanical components. In conjunction, the CMOS device may need to be passivated in a dielectric layer as used in many standard interconnect schemes.

Satisfying these discordant design requirements poses a limitation on the integration density with which the electromechanical and CMOS devices may be situated. For example, 500 nm of isotropic etching is needed to release an electromechanical system structure, which translates to about 250 nm of separation between the CMOS device and the electromechanical system device, if the electromechanical system structure can be released from two sides. If the electromechanical system structure can only be released from one side, 500 nm of etching may be required. Some solutions developed to solve this problem involve the fabrication of the electromechanical system on a separate wafer and then bonding that wafer to the CMOS device, but those solutions experience a similar limitation on integration density.

BRIEF SUMMARY

Accordingly, one aspect of the present invention is to provide for a method of fabricating an integrated electromechanical device and proximate CMOS device structure on a semiconductor substrate, where a barrier layer separates the electromechanical device and the CMOS device. Another aspect of the present invention is to provide for an integrated electromechanical device and a proximate CMOS device structure on a semiconductor substrate, where the electromechanical system and CMOS device are separated by a barrier layer.

An example embodiment of the present invention is a method for fabricating an integrated electromechanical device and a proximate CMOS device including the followings steps: positioning the electromechanical device and the CMOS device on a substrate, encapsulating the electromechanical device and the CMOS device in a protective layer, removing a portion of the protective layer, forming a barrier layer inside the missing portion of the protective layer, and removing the protective layer encapsulating the electromechanical device. The barrier layer may arrest an etchant process that removes the protective layer around the electromechanical device from removing the protective layer around the CMOS device.

Implementations may include one or more of the following features. The substrate may be silicon-on-insulator. The electromechanical device may be MEMS or NEMS. The electromechanical device and the CMOS device may be separated by no more than 250 nanometers. Example materials for composing the barrier layer may include amorphous carbon, Carbon Nitride, a plasma deposited fluorocarbon, a carbon-based polymer, Tantalum Nitride, Titanium Nitride, Hafnium Oxide, or another effective material. The protective layer may be silicon dioxide. The barrier layer may be removed by a dry etch process.

Another example embodiment of the present invention is an integrated electromechanical device and a proximate CMOS device structure. The CMOS device may be situated on a semiconductor substrate. A protective layer may encapsulate part or the entire electromechanical device, and a barrier layer separates the electromechanical device from the CMOS device. The barrier layer may have a higher etch grade than the protective layer, where the barrier layer can withstand an etch process designed to remove the protective layer.

Implementations may include one or more of the following features. The substrate may be silicon-on-insulator. The electromechanical device may be a MEMS or NEMS. The electromechanical device and the CMOS device may be separated by no more than 250 nanometers. Example materials for composing the barrier layer may include amorphous carbon, Carbon Nitride, a plasma deposited fluorocarbon, a carbon-based polymer, Tantalum Nitride, Titanium Nitride, Hafnium Oxide, or another effective material. The protective layer may be silicon dioxide, as well as other dielectric materials.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-2E.

Figure 1:
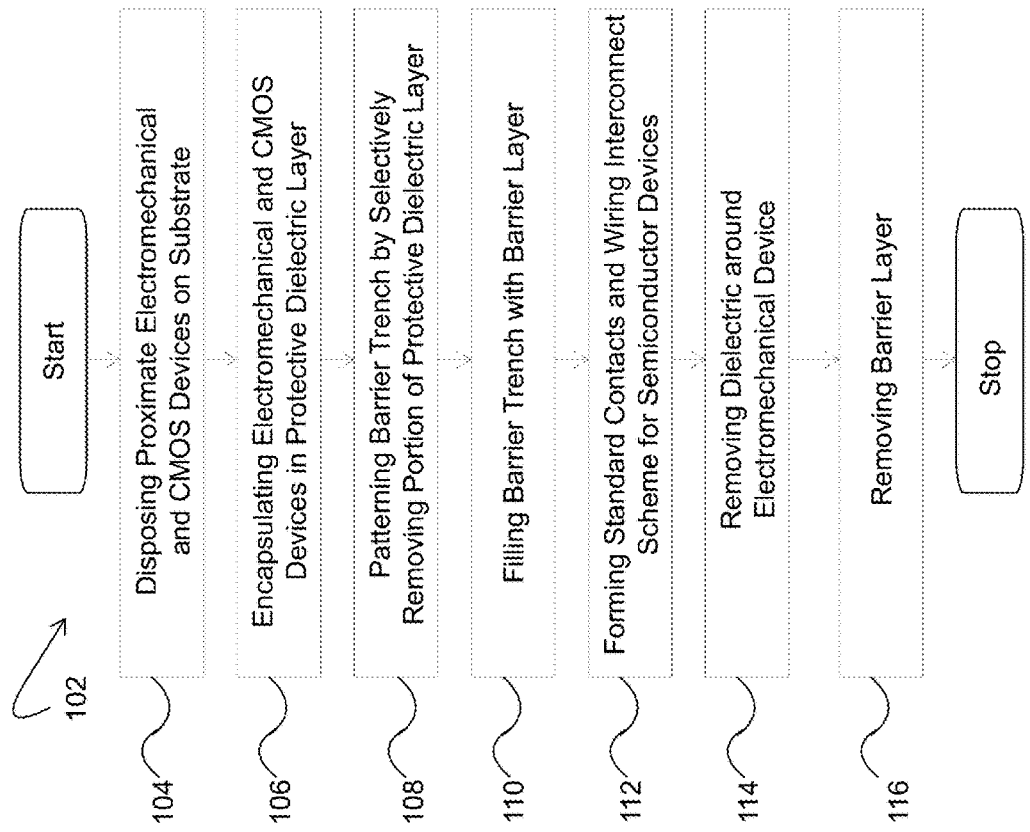
FIG. 1 is a flow chart depicting a multilayer or silicon-on-insulator fabrication process where a MEMS or NEMS device is integrated with a CMOS device configured in accordance with one embodiment of the present invention.

FIG. 1 is an example flow chart depicting a fabrication process 102 for creating an integrated semiconductor device structure that includes the steps of: disposing an electromechanical device and a CMOS device on a substrate 104, encapsulating the electromechanical device and the CMOS device in a protective layer 106, patterning a barrier trench by selectively removing a portion of protective layer between the electromechanical device and the CMOS device 108, filling the barrier trench with a barrier layer 110, forming contacts and a wiring interconnect scheme for the CMOS and electromechanical devices 112, removing the protective layer around the electromechanical device 114, and removing the barrier layer 116. For the substrate in this inventive embodiment, silicon-on-insulator technology may be used, but other multilayer wafer substrates are also contemplated for this embodiment, such as those involving polycrystalline, or polysilicon. The electromechanical device may be, for example, a microelectromechanical system (MEMS) or a nanoelectromechanical system (NEMS).

In operation 104, the electromechanical device and the CMOS device may be disposed on a substrate, and may be separated by a distance no greater than 250 nanometers. In operation 106, the protective layer may be a dielectric, such as silicon dioxide, but other insulating materials are contemplated.

In operation 108, the selectively removing of a portion of the protective layer may proceed past the protective layer and remove a portion of the substrate. This removed portion may be described as a barrier trench. For a SOI substrate, lithographic and reactive ion etching processes may be used to penetrate the protective layer making this barrier trench. The width and placement of the barrier trench are limited to a lithographic tolerance equivalent to the limits assumed for contact level patterning in modern CMOS processes. The depth of the barrier trench may need to surpass the plane on which the electromechanical and CMOS devices are fabricated, based on some margin (A) that depends on the amount of lateral etchant needed to release the electromechanical structure (B), where A is significantly greater than B. For an SOI substrate, the barrier trench may proceed past the top silicon layer and into the buried oxide (BOX) layer. In some situations, it may be advisable to proceed past the BOX layer altogether and into the silicon pit. A primary restriction on the depth of the barrier trench may include choosing a tenable aspect ratio of A to B.

In operation 110, the formed barrier layer may intersect a plane existing underneath the electromechanical device and the CMOS device. The barrier layer may have a higher etch grade, or etch tolerance, than the protective layer. Etch grade, or etch tolerance, describes a material's ability to withstand an etchant or etching technique, where a higher etch grade corresponds to a material's capability of withstanding a specific etchant. Where a lateral etch removes the protective layer, the barrier layer may arrest the etchant from proceeding any further because of the barrier layer's higher etch grade. Depending on the design specifications of the integrated structure, the barrier layer may comprise an insulator material, a metal, or some other conductive material. In an embodiment that uses silicon dioxide as the protective layer, a design specification of the barrier layer material may be that it is impervious to a silicon dioxide based etchant. Example materials for composing the barrier layer may include amorphous carbon, Carbon Nitride, a plasma deposited fluorocarbon, a carbon-based polymer, Tantalum Nitride, Titanium Nitride, Hafnium Oxide, or another effective material.

In operation 114, a portion of the protective layer may be removed from around the electromechanical device by several processes. Lithography and reactive ion etching may be performed directly above the electromechanical device. Additionally, an isotropic etch may be applied to remove undesired substrate or protective layer from around or under the electromechanical device. An undercut of the barrier layer may be acceptable to within a certain tolerance.

In operation 116, the barrier layer may be removed by using a dry etch process selective of the protective layer, which may be silicon dioxide or another suitable material. A wet etch process may also be used, such as immersion in hydrochloric acid, but dry etch processes, as those popular in the MEMS industry, present several desirable benefits. Dry etch processes may eliminate stiction effects caused by surface drying that occurs in wet etch processes.

It is important to note that the order of steps in this embodiment of the fabrication process 102 should not be meant to be exclusive, and operations may be combined or done in alternate sequences that differ from the current embodiment shown in FIG. 1.

FIGS. 2A through 2E constitute a sequence of perspective diagrams showing a plurality of certain steps in the process of manufacturing an integrated electromechanical device and CMOS device on a substrate, including an intermediate step of fabricating a barrier layer in accordance to one inventive embodiment.

Figure 2A:
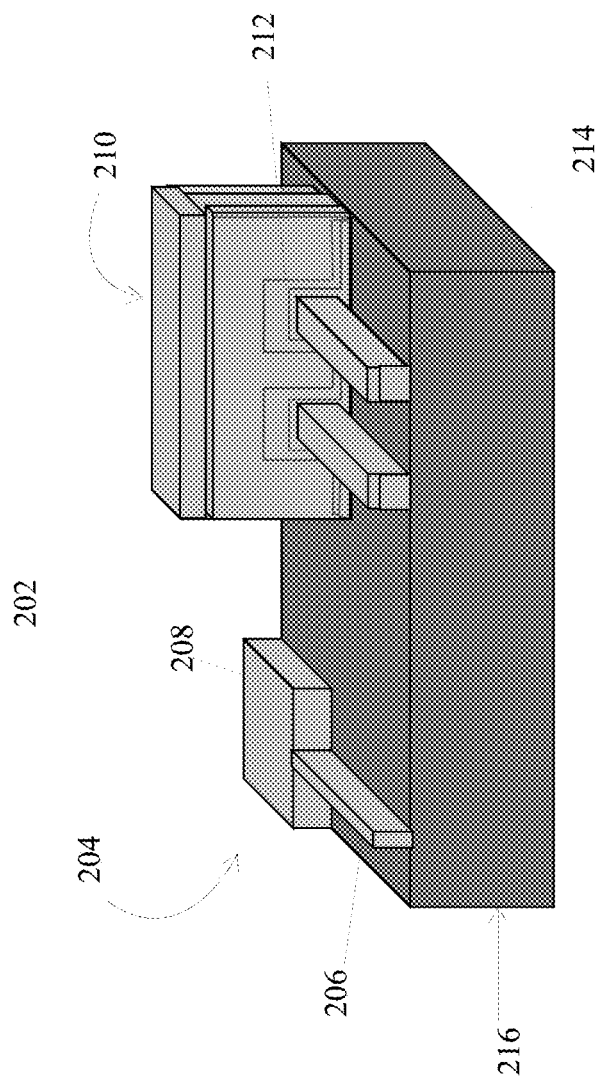
FIG. 2A is a perspective diagram illustrating an integrated electromechanical system and CMOS structure, where an electromechanical device and a CMOS device are positioned on a substrate.

FIG. 2A is a perspective diagram illustrating an integrated electromechanical system and CMOS structure 202, where an electromechanical device 204 and a CMOS device 210 are positioned on a substrate 216. The substrate 216 may be an SOI substrate, but other multilayer wafer substrates are contemplated, such as those utilizing polycrystalline silicon, or polysilicon. The CMOS device 210 may be proximate the electromechanical device 204. The electromechanical device 204 may be, for example, a microelectromechanical system (MEMS) or a nanoelectromechanical system (NEMS). The electromechanical device 204 includes a cantilever beam 206 and an anchor structure 208. The CMOS device 210 includes a gate 212 and a source/drain 214. As seen in FIG. 2A, the cantilever beam 206 of the electromechanical device 204 is attached to the substrate 216. This structure 202 corresponds to operation 104 in FIG. 1.

Figure 2B:
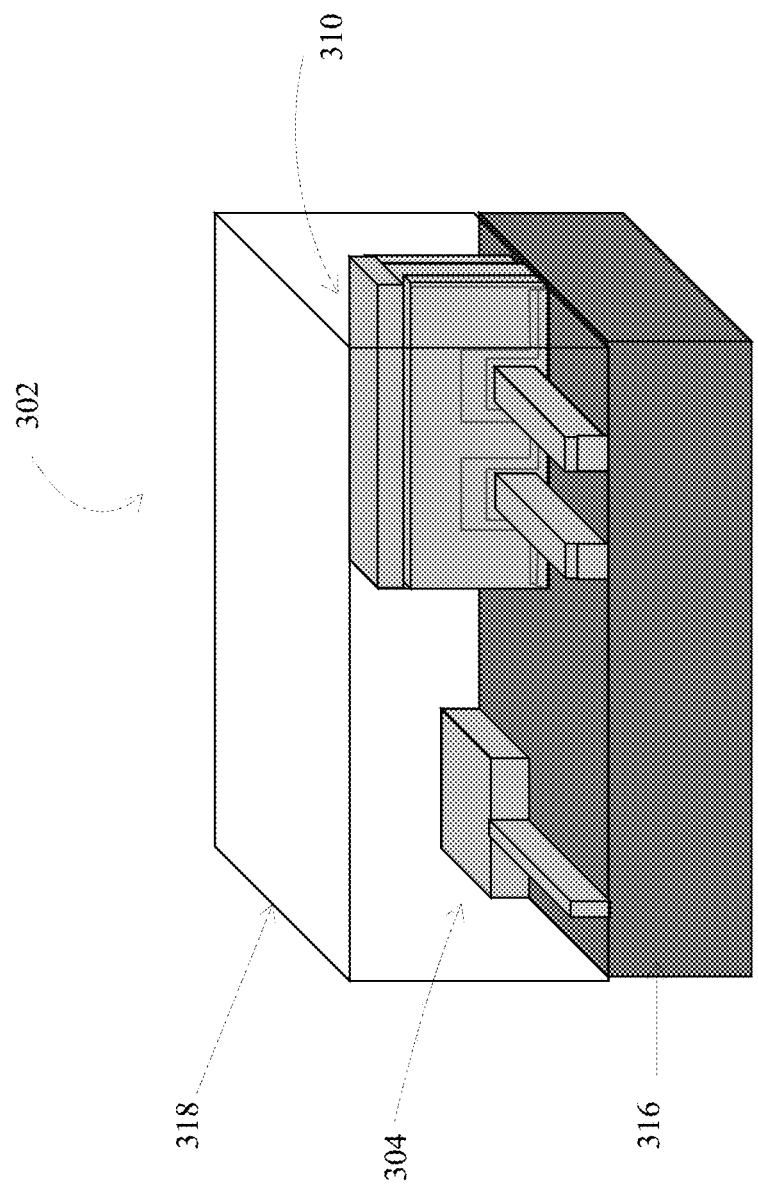
FIG. 2B is a perspective diagram illustrating an integrated electromechanical system and CMOS structure, where an electromechanical system device and a CMOS device are positioned on a substrate.

FIG. 2B is a perspective diagram illustrating an integrated electromechanical system and CMOS structure 302, where an electromechanical system device 304 and a CMOS device 310 are positioned on a substrate 316. The CMOS device 310 may be proximate the electromechanical device 312. In this embodiment, a protective layer 318 encapsulates the electromechanical structure 304 and the CMOS device 310. This structure 302 corresponds to operation 106 in FIG. 1.

Figure 2C:
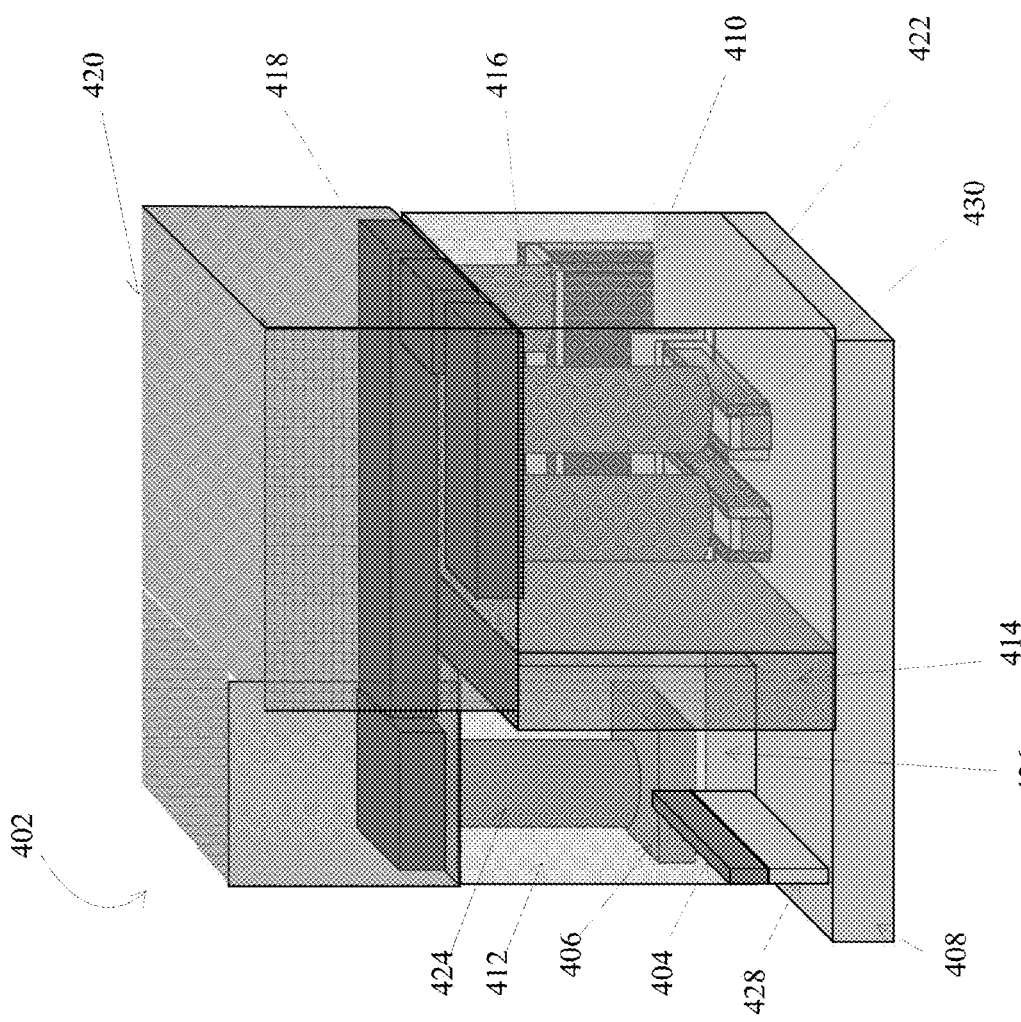
FIG. 2C is a perspective diagram illustrating an integrated structure including a substrate with an electromechanical device, a CMOS device proximate the electromechanical device, and a barrier layer.

FIG. 2C is a perspective diagram illustrating an integrated structure 402 including a substrate 408 with an electromechanical device 412, a CMOS device 410 proximate the electromechanical device 412, and a barrier layer 414. The electromechanical device 412 on the substrate 408 may comprise an anchor 406 and a cantilever 404. As seen in FIG. 4, the electromechanical device 412 and the CMOS device may be separated by a distance of 250 nanometers or less. In this embodiment, the cantilever 404 has not been released from the buried oxide layer 428 remaining from previous operations.

Keeping with FIG. 2C, a protective layer 422 may encapsulate the CMOS device 410, and a buried oxide layer 426 may encapsulate part of the electromechanical device 412. The protective layer may comprise silicon dioxide or another insulating material. Inside a mask, wiring 418 may form a standard interconnect fabrication scheme that entails contacts 416, 424, which form connections to the electromechanical device 412 and the CMOS device 410.

Furthermore, in FIG. 2C, separating the electromechanical device 412 and the CMOS device 410 is a barrier layer 414. The barrier layer 414 may have a higher etch resistance than the protective layer's 412 dielectric material, allowing the barrier layer 414 to arrest a lateral etch or isotropic etch from removing the protective layer 422 around the CMOS device 410. Regardless of the dimensions shown in the figure, the barrier layer 414 may extend below the lowest point of the CMOS device 410 into the substrate 408, thereby intersecting a plane underneath both the electromechanical device 412 and the CMOS device 410. Also, despite the depiction of the barrier layer in FIG. 2C, the barrier layer need not be limited to a rectangular shape. Other embodiments are contemplated, where the barrier layer is circular, polygonal, or surrounds the CMOS device 410 partially or completely. Materials used for the barrier layer may include amorphous carbon, Carbon Nitride ($C_3N_4$), plasma deposited fluorocarbon, carbon-based polymer, Tantalum Nitride (TaN), Titanium Nitride (TiN), and Hafnium Oxide ($HfO_2$). This structure 402 corresponds to operation 116 in FIG. 1.

Figure 2D:
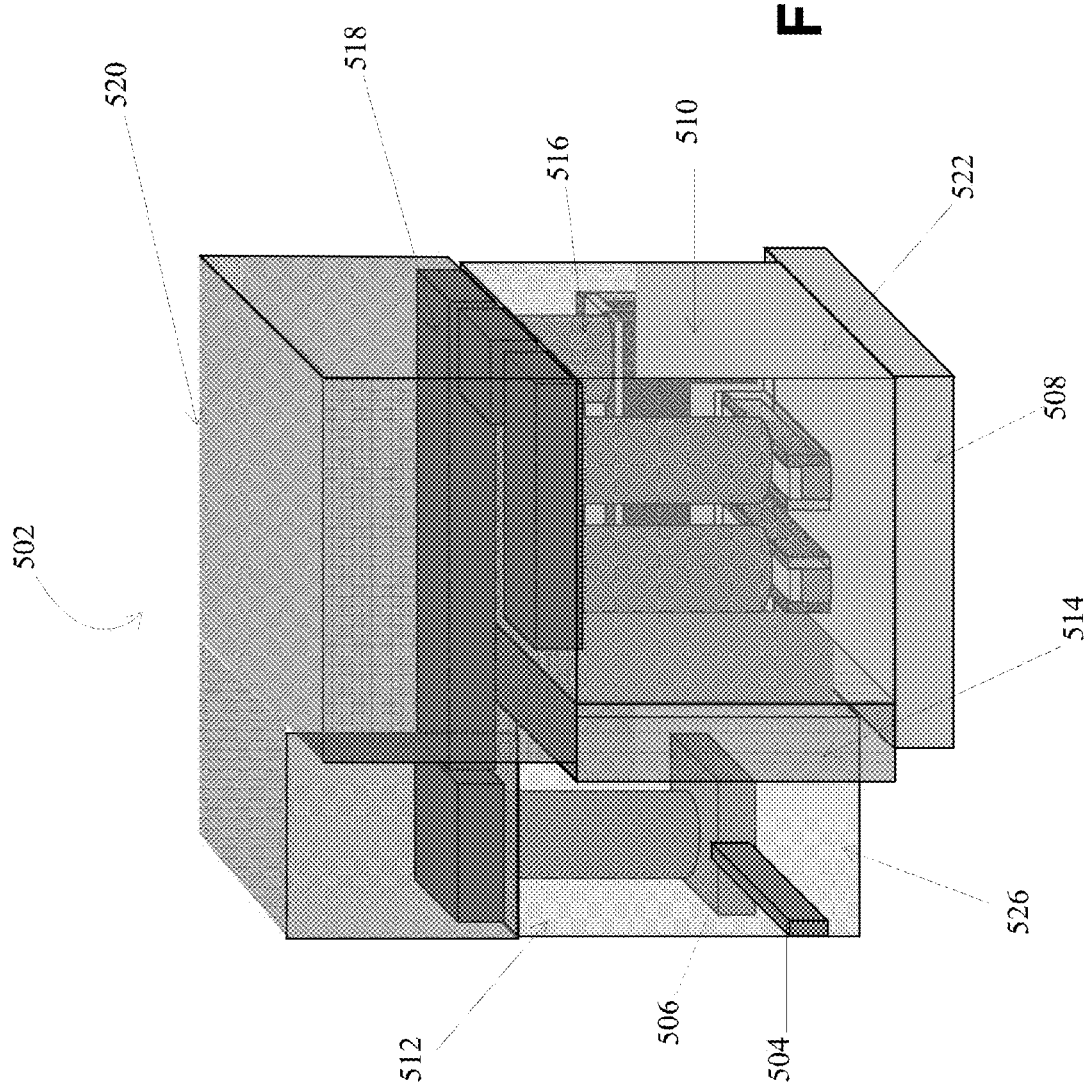
FIG. 2D is a perspective diagram illustrating an integrated electromechanical and CMOS structure, where an electromechanical device is detached from a substrate, while a CMOS device is positioned on the substrate.

FIG. 2D is a perspective diagram illustrating an integrated electromechanical and CMOS structure 502, where an electromechanical device 512 is detached from a substrate 508, while a CMOS device 510 is positioned on the substrate 508. A barrier layer 514 separates the electromechanical device 512 and the CMOS device 510. A buried layer 526 encapsulates part of the electromechanical device 512, while a protective layer 522 encapsulates the CMOS device 510. An anchor structure 506 is situated on a buried layer 526 below the electromechanical device 512, while a cantilever beam 504 extends from the anchor structure 506. The cantilever beam 504 is enabled for mechanical movement. Inside a mask 520, wiring 518 may form a standard interconnect fabrication scheme that entails contacts 516, which form connections to electromechanical device 512 and the CMOS device 510.

Figure 2E:
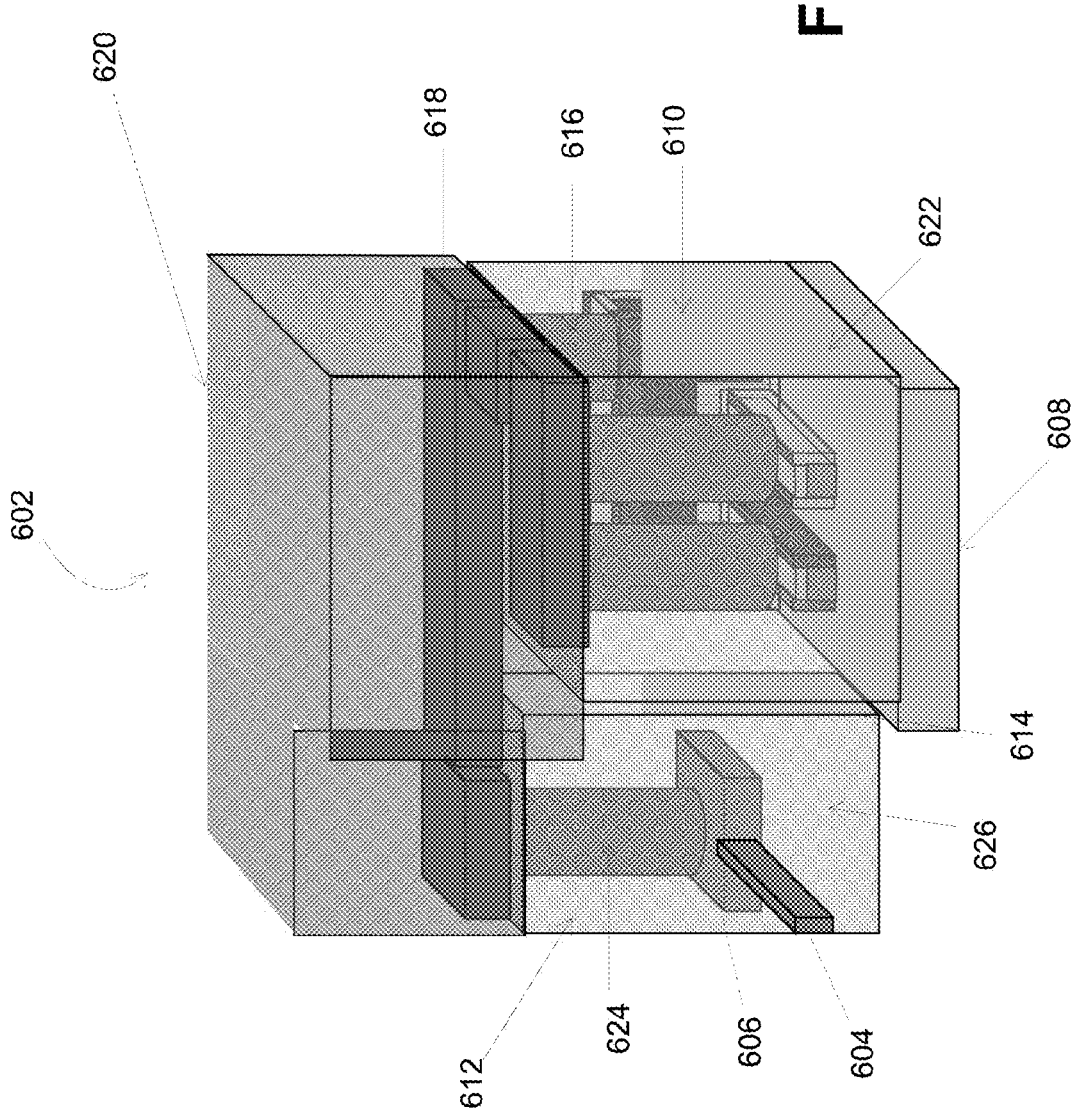
FIG. 2E is a perspective diagram illustrating an integrated electromechanical device and CMOS structure, where an electromechanical device is detached from a substrate, while a CMOS device is positioned on the substrate.

FIG. 2E is a perspective diagram illustrating an integrated electromechanical device and CMOS structure 602, where an electromechanical device 612 is detached from a substrate 608, while a CMOS device 610 is positioned on the substrate 608. A gap 614 separates the electromechanical device 612 and the CMOS device 610, where a barrier layer existed previously. A buried layer 626 below part of the electromechanical device 612, while a protective layer 622 encapsulates the CMOS device 610. An anchor structure 606 is situated on the buried layer 626 around the electromechanical device 612, while a cantilever beam 604 extends from the anchor structure 606. The cantilever beam 604 is enabled for mechanical movement. Wiring 618 and contacts 616, 624 form a standard interconnect fabrication scheme. This structure 602 corresponds to operation 116 in FIG. 1.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method for fabricating an integrated semiconductor device structure on a substrate, the method comprising:
   disposing an electromechanical device on said substrate, the electromechanical device including an anchor and a cantilever beam connected to the anchor, the anchor and the cantilever beam positioned above the substrate, the cantilever beam extending from the anchor and is enabled for mechanical movement;
   disposing a complementary metal oxide semiconductor (CMOS) device proximate the electromechanical device on said substrate;
   encapsulating the electromechanical device and the CMOS device with a protective layer, a portion of the protective layer positioned directly below the anchor and between the anchor and the substrate;
   selectively removing at least a portion of the protective layer between the electromechanical device and the CMOS device; and
   filling the removed portion with a barrier layer having a higher etch grade than the protective layer, and wherein the barrier layer separates the CMOS device and the electromechanical device.

2. The method of claim 1, wherein the barrier layer intersects a plane below the electromechanical device and the CMOS device.

3. The method of claim 1, wherein the substrate is a silicon-on-insulator substrate.

4. The method of claim 1, wherein the electromechanical device is a nanoelectromechanical system (NEMS).

5. The method of claim 1, wherein the protective layer is silicon dioxide.

6. The method of claim 1, wherein the barrier material has an etch resistance higher than the protective layer.

7. The method of claim 1, wherein the barrier layer is one of amorphous carbon, Carbon Nitride (C3N4), a plasma deposited fluorocarbon, a carbon-based polymer, Tantalum Nitride (TaN), Titanium Nitride (TiN), and Hafnium Oxide (HfO2).

8. The method of claim 1, further comprising removing the barrier layer.

9. The method of claim 1, wherein the electromechanical device and the CMOS device are separated by a distance no greater than 250 nanometers.

10. The method of claim 1, wherein removing the barrier layer includes a dry etch process.

* * * * *